United States Patent [19]

Shenoy et al.

[11] Patent Number: 6,025,647

[45] Date of Patent: Feb. 15, 2000

[54] APPARATUS FOR EQUALIZING SIGNAL PARAMETERS IN FLIP CHIP REDISTRIBUTION LAYERS

[75] Inventors: Jayarama N. Shenoy, Santa Clara; Richard L. Wheeler, San Jose, both of Calif.

[73] Assignee: VLSI Technology, Inc., San Jose, Calif.

[21] Appl. No.: 08/976,564

[22] Filed: Nov. 24, 1997

[51] Int. Cl.[7] .................................................. H01L 23/48
[52] U.S. Cl. .......................... 257/775; 257/773; 257/203
[58] Field of Search .................................... 257/775, 773, 257/203, 208, 778

[56] References Cited

U.S. PATENT DOCUMENTS 5,473,195  12/1995  Koike ....................................... 257/775

*Primary Examiner*—Carl Whitehead, Jr.
*Assistant Examiner*—Roy Potter

*Attorney, Agent, or Firm*—Martine Penilla & Kim, LLP

[57] ABSTRACT

Disclosed is a redistribution layer having a patterned metallization layer for use in a flip chip integrated circuit device and a method for making the same. The redistribution layer includes a plurality of slot pads arranged along a periphery of the redistribution layer. The plurality of slot pads are formed from the patterned metallization layer. An array of bump pads are arranged in an inner portion of the redistribution layer such that the plurality of slot pads surround the array of bump pads, and the array of bump pads are formed from the patterned metallization layer. The redistribution layer further includes a plurality of traces that are formed from the patterned metallization layer and are configured to interconnect the plurality of slot pads to the array of bump pads. Each of the traces has a width that is selected to substantially equalize a resistance parameter associated with each of the plurality of traces. Additionally, each trace may include a bump pad area and possibly capacitance extending stubs that may be custom sized to substantially equalize a capacitance parameter associated with each of the plurality of traces.

30 Claims, 9 Drawing Sheets

APPARATUS FOR EQUALIZING SIGNAL PARAMETERS IN FLIP CHIP REDISTRIBUTION LAYERS

BACKGROUND OF THE INVENTION

1. Field of the Invention

The present invention relates generally to integrated circuit (IC) devices and, more particularly, to a method for forming a redistribution layer of a flip chip IC device including structures formed by such method.

2. Description of the Related Art

Currently, in order to remain competitive in the IC industry, IC designers must continuously reduce the overall size and corresponding cost of IC devices. Thus, IC device features continue to shrink. As a result of this trend toward smaller feature sizes, circuit density has correspondingly increased. That is, many IC designers pursue ways to significantly increase the feature density so as to take full advantage of significant decreases in feature size. As a result, IC designers must also continue to increase the I/O pin density so as to take full advantage of significant increases in feature density. With these goals in mind, IC chip designers have developed a wide variety of package designs to maximize I/O pin density.

One package design includes an array of pads to provide interconnections between the IC devices within the package and other electrical components or IC devices external to the package. Flip chip type packages are an example of packages that use arrays of interconnecting pads. An array configuration allows the designer to utilize the entire package area for I/O pin placement, as opposed to package designs which merely provide I/O pins around the package periphery.

Although flip chip IC designs have many advantages, a problem with flip chip IC designs is skew between signals that are traveling along adjacent traces on a redistribution layer. Skew is defined as the difference in propagation times of various signals as the signals traverse from one point to another. The redistribution layer is a layer that is formed over a topmost layer of a flip chip IC to enable electrical interconnection to a particular package via solder bumps. The redistribution layer has a number of traces that interconnect a plurality of pads that are routed to each of the solder bumps that are arranged in an array format. It has been found that the skew between adjacent traces is directly related to the differences in capacitance and resistance associated with each of the traces, which are typically of varying lengths.

Another problem with conventional redistribution layers is that of variable coupled noise that occurs between adjacent traces of varying lengths on the redistribution layer. It is believed that the variation in coupled noise is related to the difference in resistance between I/O lines.

Figure 1A:
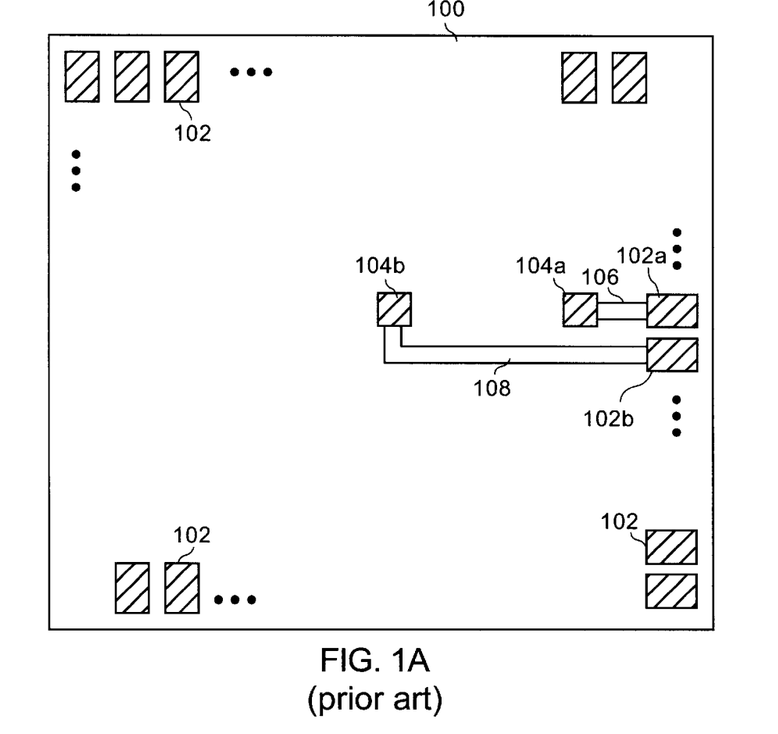
FIG. 1A is a top view of a conventional redistribution layer that includes a plurality of patterned metallization features.

FIG. 1A is a top view of a conventional redistribution layer 100 that includes a plurality of patterned metallization features. These patterned features typically include slot pads 102 which are interconnected to bump pads 104 via traces. For example, a trace 106 is used to interconnect slot pad 102a to bump pad 104a, and a trace 108 is used to interconnect slot pad 102b to bump pad 104b. As shown, slot pads 102 are arranged around the periphery of the redistribution layer 100, while bump pads 104 are arranged in an array configuration within the interior region of the redistribution layer 100. As mentioned above, the purpose of the redistribution layer 100 is to distribute signals that are received from the slot pads 102 to each of the bump pads 104. Generally, the slot pads 102 are connected to underlying devices (not shown) that are fabricated in a flip chip IC that underlies the redistribution layer 100. Once the redistribution layer 100 is formed over the flip chip IC, solder balls are connected to each of the bump pads 104 to enable interconnect to the I/O pins of a given package.

Figure 1B:
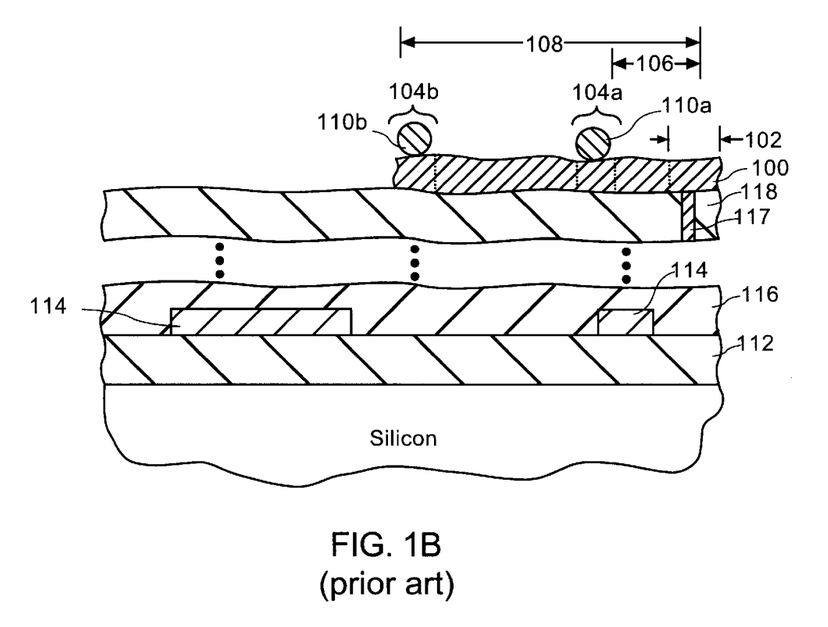
FIG. 1B is a cross section view of a semiconductor device having a plurality of conventionally fabricated layers.

FIG. 1B is a cross section view of a semiconductor device having a plurality of conventionally fabricated layers. IC devices, such as transistors are generally formed on a the silicon substrate and then interconnected with subsequently formed metallization layers and conductive vias. As shown, a base oxide 112 (e.g., $SiO_2$) is deposited over the silicon substrate. Next, a first metallization layer 114 is deposited and patterned over the base oxide 112 to form a first level of interconnect lines. A first dielectric layer 116 is then formed over the first metallization layer 114. The process may then be repeated to form a plurality of metallization and dielectric layers as needed for a particular application. Once the intermediate layers are fabricated, a top most dielectric layer 118 is formed.

The redistribution layer 100 is typically located between the top most dielectric layer 118 and a package (not shown). As mentioned above, the redistribution layer 100 is in the form of a patterned metallization layer that includes bump pads 104, traces (e.g., 106 and 108), and slot pads 102.

Bumps 110 are then formed on each of the bump pads 104 using conventional solder ball application techniques. Each dielectric layer may then contain a via network for interconnecting the IC devices that are formed on the substrate. For example, a via network 117 connects an underlying metallization layer (not shown) with the redistribution layer 100. Other via networks (not shown) are then utilized to connect other underlying metallization layers to IC devices that are formed on the substrate.

The dielectric and metallization layers are typically patterned using well known photolithography techniques. Patterning is typically accomplished by depositing a photoresist layer over the layer to be patterned, and then selectively exposing the photoresist to light through a patterned reticle. Once exposed, the photoresist is developed to form a photoresist mask that is used in etching layers that are exposed and not covered by the photoresist material.

As described above, one disadvantage with the conventional redistribution layer 100 of FIGS. 1A and 1B is that the resulting traces 106 and 108 have varying trace lengths. For example, trace 106 is significantly shorter than trace 108. Variable trace lengths may result in unacceptable signal skew values between adjacent trace signals. For example, the innermost bump pad 104b and the outermost bump pad 104a will have an unacceptable signal skew between them because trace 108 is much longer than trace 106.

In order to minimize the aforementioned skew and noise problems, designers have been forced to limit the number of bumps pads 104 contained in the redistribution layer 100. When the number of bump pads is reduced, the result is to reduce the difference in length between the outermost trace and innermost trace. Although this technique is well suited to somewhat reduce the skew and noise problems to levels that comply with specifications requirements, the allowable I/O density of a redistribution layer 100 will also necessarily decrease.

Figure 1C:
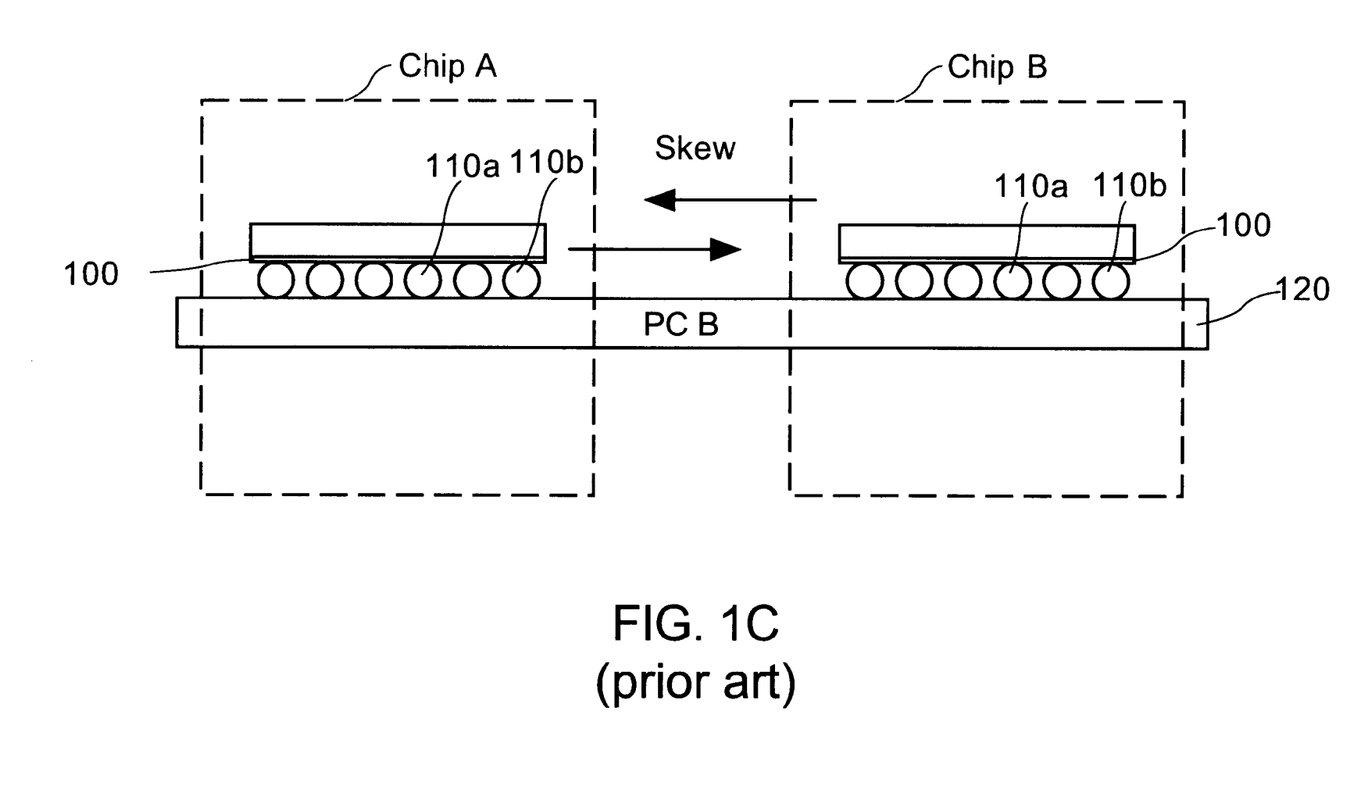
FIG. 1C provides a representation of skew between two conventional flip devices that have redistribution layers.

To further illustrate the aforementioned skew problems, FIG. 1C provides a representation of skew between two conventional flip devices that have redistribution layers 100. After bumps 110 are placed upon the bump pads 104 of the redistribution layers 100, the flip chip device is then inverted onto a PC Board 120. The bumps 110 of a Chip A are then electrically connected to the bumps 110 of a Chip B through electrical traces that are patterned on the PC Board 120. For example, bump 110*a* of the Chip A may be connected to bump 110*a* of the Chip B. Likewise, bump 110*b* of the Chip A may be connected to bump 110*b* of the Chip B.

Because bump 110*a* has a longer trace than bump 110*b*, signal skew is consequently introduced between the chips. As a result, if the skew grows to levels that exceed the specification, performance problems may result when signals are passed between chips. In some cases, a significant amount of skew may cause Chip B to misread the signals received from Chip A and, consequently, cause Chip B to execute invalid operations.

Figure 1D:
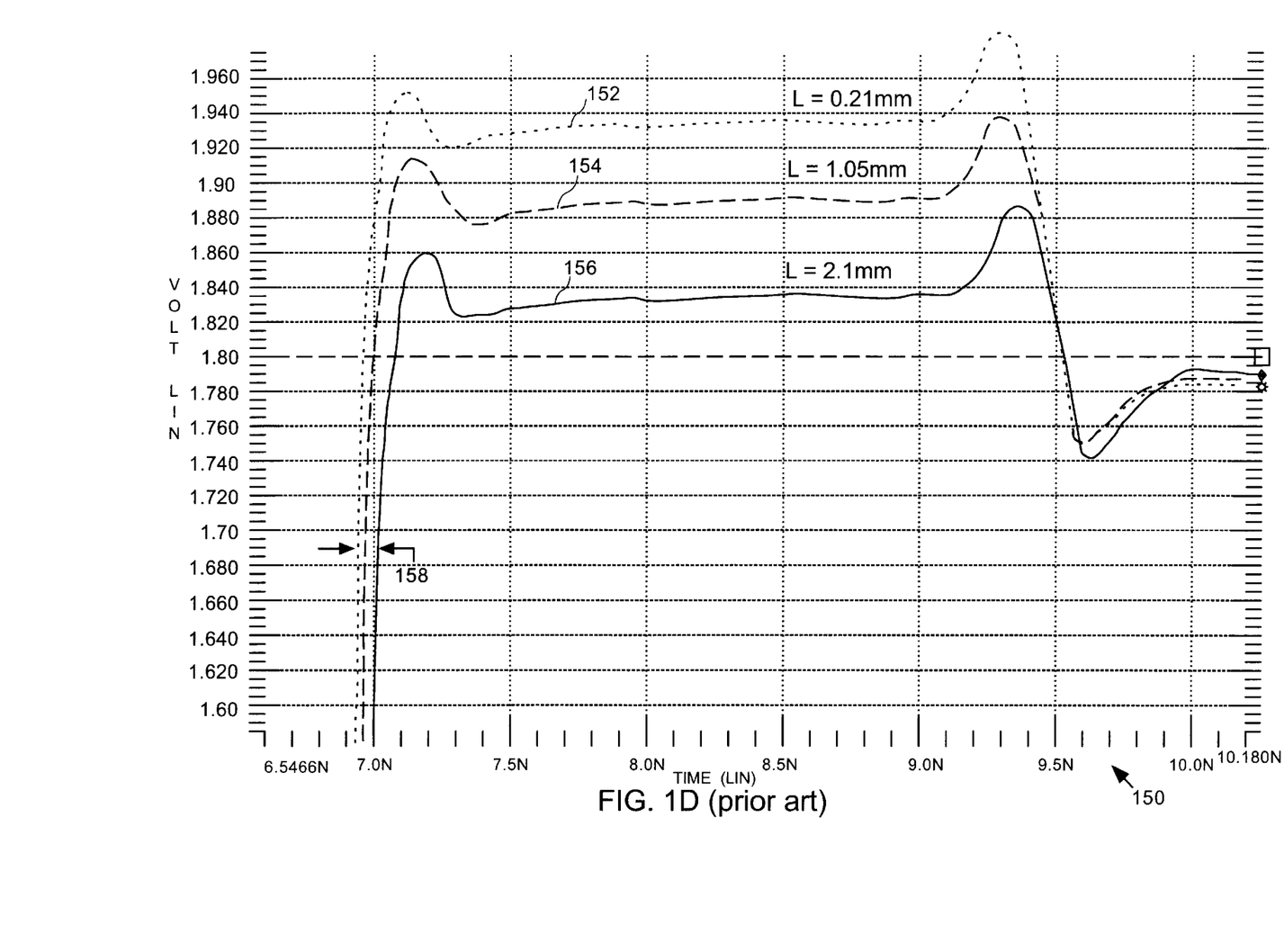
FIG. 1D is a representation of skew and variable voltage levels for different I/O signals within a conventional redistribution layer.

FIG. 1D is a representation of skew and variable voltage levels for different I/O signals within a conventional redistribution layer 100. FIG. 1D illustrates skew 158 between different I/O signals (152, 154, 156). As shown, each I/O signal has a different overshoot that results in skew 158. That is, each I/O signal has a different rise time. This variation in rise time, commonly referred to as an overshoot, contributes to the signal skew 158 between I/O signals.

Additionally, FIG. 1D represents another disadvantage of the conventional redistribution layer 100—the variation of coupled noise between I/O signals. The ability to control the coupled noise is particularly important for certain types of I/O drivers. Since coupled noise on a particular I/O signal depends on that signal's voltage level, which level is affected by the resistance of the signal's trace within the redistribution layer 100, a signal's voltage level will be different for each respective trace length. For example, a trace length of 0.21 mm has a voltage level of about 1.94 V, while a trace length of 2.1 mm has a voltage level of about 1.84. See FIG. 1D. This difference in voltage levels results in a difference in coupled noise.

To correct the problems of skew and noise, the IC designer must sacrifice I/O density. In other words, the IC designer must face trade-offs between increasing density and controlling coupled noise and skew. In balancing these needs, IC designers typically choose between a number of conventional approaches for designing the redistribution layers 100.

One approach for balancing these needs is to use traces that have the same lengths, and thereby relax the density requirements. Although this works fine for devices in which increased density is not an issue, this approach requires a substantial amount of customization of the redistribution layer 100. Of course, such customization is not always suitable in many applications, such as application specific integrated circuit (ASIC) devices, in which budget constraints limit the amount of time and money available to complete a device. In sum, this solution results in a huge decrease in I/O density and an increase in design complexity, time, and cost.

Accordingly, in view of the foregoing, there is a need for a method of fabricating standardized redistribution layers that allow for variable length traces while substantially minimizing signal skew and coupled noise problems, while providing a high I/O density.

SUMMARY OF THE INVENTION

Broadly speaking, the present invention fills these needs by providing a redistribution layer that is equalized in terms of capacitance and in terms of resistance for signals that are communicated through the redistribution layer to substantially minimize skew between signals and control coupled noise. It should be appreciated that the present invention can be implemented in numerous ways, including as a process, an apparatus, a system, a device, or a method. Several inventive embodiments of the present invention are described below.

In one embodiment, a redistribution layer having a patterned metallization layer for use in a flip chip integrated circuit device is disclosed. The redistribution layer includes a plurality of slot pads arranged along a periphery of the redistribution layer. The plurality of slot pads are formed from the patterned metallization layer. An array of bump pads are arranged in an inner portion of the redistribution layer such that the plurality of slot pads surround the array of bump pads, and the array of bump pads are formed from the patterned metallization layer. The redistribution layer further includes a plurality of traces that are formed from the patterned metallization layer and are configured to interconnect the plurality of slot pads to the array of bump pads. Wherein each of the traces has a width that is selected to substantially equalize a resistance parameter associated with each of the plurality of traces.

In another embodiment, a redistribution layer that is formed from a patterned metallization layer is disclosed. The redistribution layer includes a plurality of slot pads that are arranged along a periphery of the redistribution layer. The plurality of slot pads are formed from the patterned metallization layer. Further, a first slot pad has a first slot pad capacitance value, and a second slot pad has a second slot pad capacitance value. An array of bump pads are arranged in an inner portion of the redistribution layer, such that the plurality of slot pads surround the array of bump pads. The array of bump pads are formed from the patterned metallization layer, such that a first bump pad of the array of bump pads has a first surface area that has a first bump pad capacitance value and a second bump pad of the array of bump pads has a second surface area that has a second bump pad capacitance value. A plurality of traces have a plurality of widths that are formed from the patterned metallization layer and are configured to interconnect the plurality of slot pads to the array of bump pads. A first trace that electrically connects the first bump pad to the first slot pad has a first trace capacitance and a first length, and a second trace that electrically connects the second bump pad to the second slot pad has a second trace capacitance value and a second length, and the first length is different than the second length. The redistribution layer further includes the first surface area of the first bump pad being sized such that the first bump pad capacitance value, plus the first trace capacitance value, plus the first slot pad capacitance value substantially equals the second bump pad capacitance value, plus the second trace capacitance value, plus the second slot pad capacitance value.

In yet another embodiment, a method for equalizing skew between signals communicated through a redistribution layer is disclosed. The method includes providing an integrated circuit chip having a topmost surface that has a plurality of input/output connections arranged along a periphery of the topmost surface. Applying a dielectric layer over the topmost surface of the integrated circuit chip. Applying a metallization layer over the dielectric layer. The method further includes patterning the metallization layer to define the redistribution layer. The redistribution layer has a plurality of slot pads that are arranged along the periphery of the integrated circuit chip, such that electrical contact is made with the input/output connection. The redistribution layer further includes an array of bump pads that are arranged in an inner surface region of the redistribution layer and are surrounded by the plurality of slot pads. And, the redistribution layer has a plurality of traces that interconnect the plurality of slot pads with selected ones of the array of bump pads, such that the plurality of traces have a width that varies to equalize a resistance parameter of the plurality of traces.

Advantageously, the embodiments of the present invention enable substantial equalization of resistance and capacitance along signal lines in a redistribution layer that is used in flip chip integrated circuit devices. It should be noted that when capacitance and resistance are finely tuned to achieve a level of equalization that is within an allowable specification requirement, skew between adjacent signals is minimized. Furthermore, because designers are able to minimize skew to within a particular specification, when a flip chip is connected to a PC board, only the specification allowed skew is permitted to be propagated from one chip to another chip that may be connected to the PC board. Further, when the equalization is performed in accordance with the described embodiments, it is possible to efficiently design a standardized redistribution layer that maintains a given density requirement, while reducing costs when the redistribution layer is used in application specific integrated circuit devices (ASICs). Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for methods and apparatus for equalizing capacitance and resistance in flip chip redistribution layers is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figures 2, 3A:
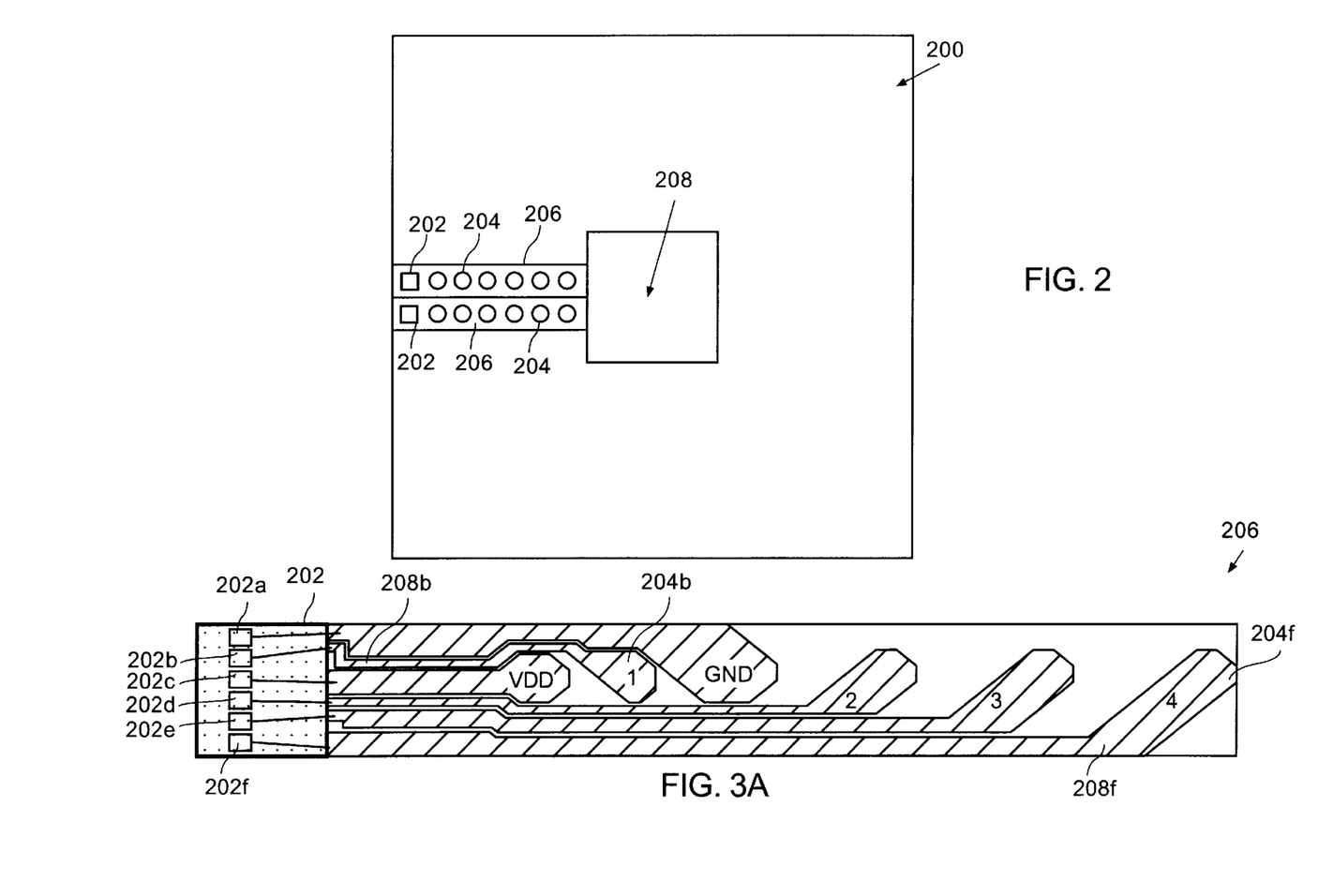
FIG. 2 is a simplified top view of a redistribution layer in accordance with one embodiment of the present invention.
FIG. 3A is a more detailed top view of an unequalized redistribution layout cell in accordance with one embodiment of the present invention.

FIG. 2 is a simplified top view of a redistribution layer 200 in accordance with one embodiment of the present invention. As shown, the redistribution layer 200 includes a plurality of redistribution layout cells 206 that are arranged around an additional power and ground routing area 208. In one embodiment, the redistribution layout cells 206 preferably encircle the additional power and ground routing area 208. Alternatively, the redistribution layout cells 206 may extend all the way to the center of the redistribution layer 200. Consequently, the additional power and ground routing area 208 would be eliminated.

The redistribution layout cells include slot pad cells 202, bump pads 204, and traces (not shown) to interconnect the slot pad cells 202 with selected ones of the bump pads 204. Slot pads 202 are arranged around the periphery of the redistribution layer 200, while bump pads 204 are arranged in an array configuration within the interior region of the redistribution layer 200. For example, the bump pads 204 are positioned within 1.5 mm from the redistribution layer's edge, and the bump pad pitch is about 200 $\mu$m for both the vertical and horizontal array directions.

Preferably, the redistribution layout cells 206 contain identical configurations of slot pad cells 202, bump pads 204, and traces. However, it may be necessary to use slot pad cells 202 with differing configurations. For example, the corner areas of the redistribution layer may require a different configuration to completely fill in the array of bump pads 204.

FIG. 3A is a more detailed top view of an unequalized redistribution layout cell 206 in accordance with one embodiment of the present invention. As shown, the redistribution layout cell 206 includes a plurality of patterned metallization features. These patterned features include slot pads (e.g., 202a~202f) which are interconnected to bump pads 204 via traces 208. The slot pads are, therefore, arranged within a slot pad cell 202, as represented in FIG. 2.

As mentioned above, the purpose of the redistribution layer 200 is to distribute signals (e.g., Vdd, GND, 1, 2, 3, and 4) that are received from the slot pads 202a through 202f to each of the bump pads 204. For example, a signal 1 is distributed from a slot pad 202b, through a trace 208b that leads to a bump pad 204b. That is, the propagation path of signal 1 includes slot pad 202b, trace 208b, and bump pad 204*b*. Similarly, a signal 4 is distributed from a slot pad 202*f*, through a trace 208*f* that leads to a bump pad 204*f*.

As mentioned above, one problem with the unequalized redistribution layout cell 206 is unacceptable skew between signals. For example, for a given trace width, signal 1 and signal 4 will have a substantial amount of skew since the trace 208*b* for signal 1 is substantially shorter than the trace 208*f* for signal 4. In this example, the skew between the signals may be as large as about 50 ps. This skew corresponds to a difference in capacitance and resistance along each signal's path. For example, a capacitance of about 1600 fF may be associated with signal 4, and a capacitance of about 450 fF may be associated with signal 1. Of course, the higher capacitance is associated with the longer trace 208*f* of signal 4. Likewise, since resistance is proportional to trace length, the resistance of signal 4 will be higher than the resistance of signal 1. This is because the length of trace 208*f* of signal 4 is about 1500 µm and the length of trace 208*b* of signal 1 is only about 650 µm. Thus, these differences in capacitance and resistance in an unequalized redistribution layout cell 206 may correlate with a skew of about 50 ps.

In addition to skew problems, the unequalized redistribution layout cell 206 may provide signals with unacceptable variations in their relative coupled noise. Variations in the coupled noise for signals may result from a difference in the resistance and capacitance along each signal's path. For example, signal 1 may have higher voltage level than signal 4 since the trace 208*b* for signal 1 is shorter than the trace 208*f* for signal 4.

Figure 3B:
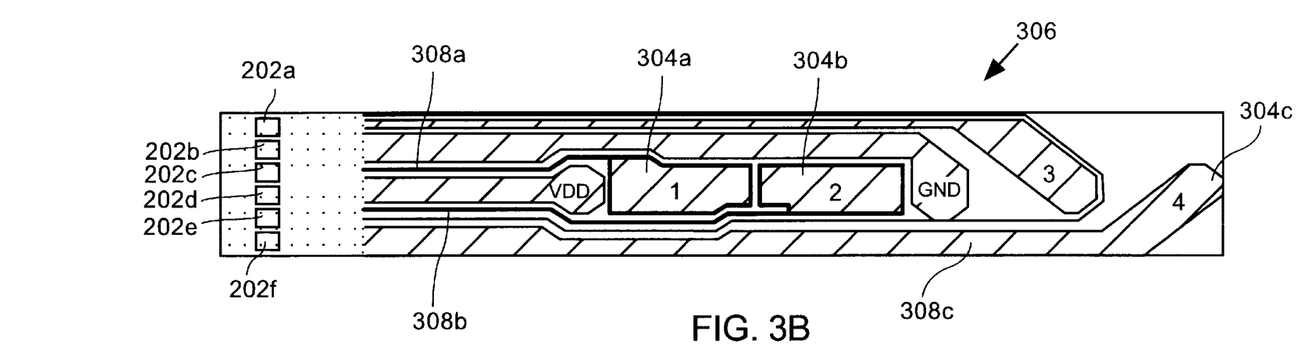
FIG. 3B is a detailed top view of an equalized redistribution layout cell in accordance with one embodiment of the present invention.

FIG. 3B is detailed top view of an equalized redistribution layout cell 306 in accordance with one embodiment of the present invention. The equalized redistribution layout cell 306 is one solution to the aforementioned problems of skew and coupled noise variation between signals. For example, the skew between signal 1 and signal 4 may be completely equalized to eliminate all of the skew and coupled noise problems depending on the particular application. In one embodiment, the specification requirements may only allow a minimum skew. For example, the equalized redistribution layout cell 306 is optimized to allow 10 ps of skew, which is a substantial improvement over the skew of about 50 ps produced by the unequalized redistribution layout cell 206 described above.

For each trace (e.g., 308*a*~308*c*), the resistance values are substantially equalized between signals. In other words, the resistance value for the path of signal 1 is about the same as the resistance value for signal 2, signal 3, and signal 4. This resistance equalization is accomplished by reducing the trace widths for the shorter traces, while increasing the trace widths for the longer traces. For example, signal 4 is a relatively long trace 308*c*, and therefore, has a wider trace width of between about 25 and 30 µm. Likewise, signal 1 is a relatively short trace 308*b*, and therefore, has a narrower trace width of about 10 µm. Of course, these dimensions are for illustrative purposes only and are not intended to limit the present embodiment. The trace width modifications complete the equalization for resistance.

For each trace (e.g., 308*a*~308*c*), the capacitance values are also substantially equalized between signals. This capacitance equalization is accomplished by increasing the size of the bump pads (e.g., 304*a* and 304*b*) that are connected to the relatively shorter traces (e.g., 308*a* and 308*b*). For example, bump pad 304*a* is about 280 µm by about 90 µm. Likewise, bump pad 304*b* is about 280 µm by about 90 µm. This increase in the bump pad area of bump pads 304*a* and 304*b* has the effect of increasing the capacitance value for each signal's path. As will be described in FIG. 4B below, the capacitance is increased because a lump capacitor is essentially produced with an underlying metallization layer. In fact, in the present example the total capacitance is increased for the path of signal 1, which path includes a slot pad 202*c*, trace 308*a*, and bump pad 304*a* (i.e., by increasing the area of bump pad 304*a*). For example purposes, the capacitance is about 1400 fF for the path of signal 1 within the equalized redistribution layout cell 306, as compared with a capacitance of about 450 fF for the path of signal 1 within the unequalized redistribution layout cell 206. These dimensions and values are for illustrative purposes only and are not intended to limit the present embodiment.

Most importantly, the pitch for the bump pads (e.g., 304*a*~304*c*) in the equalized redistribution layout cell 306 is about the same as the pitch for the bump pads (e.g., 204*b* and 204*f*) in the unequalized redistribution layout cell 206. That is, the bump pitch within the equalized redistribution layout cell 306 is still maintained at about 200 µm. Likewise, the bump pitch between bump pads (e.g., 304*a* and 304*a*) in adjacent equalized redistribution layout cells 306 is also maintained at about 200 µm. Thus, for a given x-direction and y-direction, the bump pad pitch may be maintained at about 200 µm, while advantageously equalizing both the resistance and the capacitance for each of the signal paths. Although the bump pad pitch may limit the amount of space available for the increase in the area of the bump pads (e.g., 304*a* and 304*b*), equalizing both the resistance and capacitance in the same amount of area enables designers to meet performance requirements without increasing the size of the redistribution layer 200.

Figure 4A:
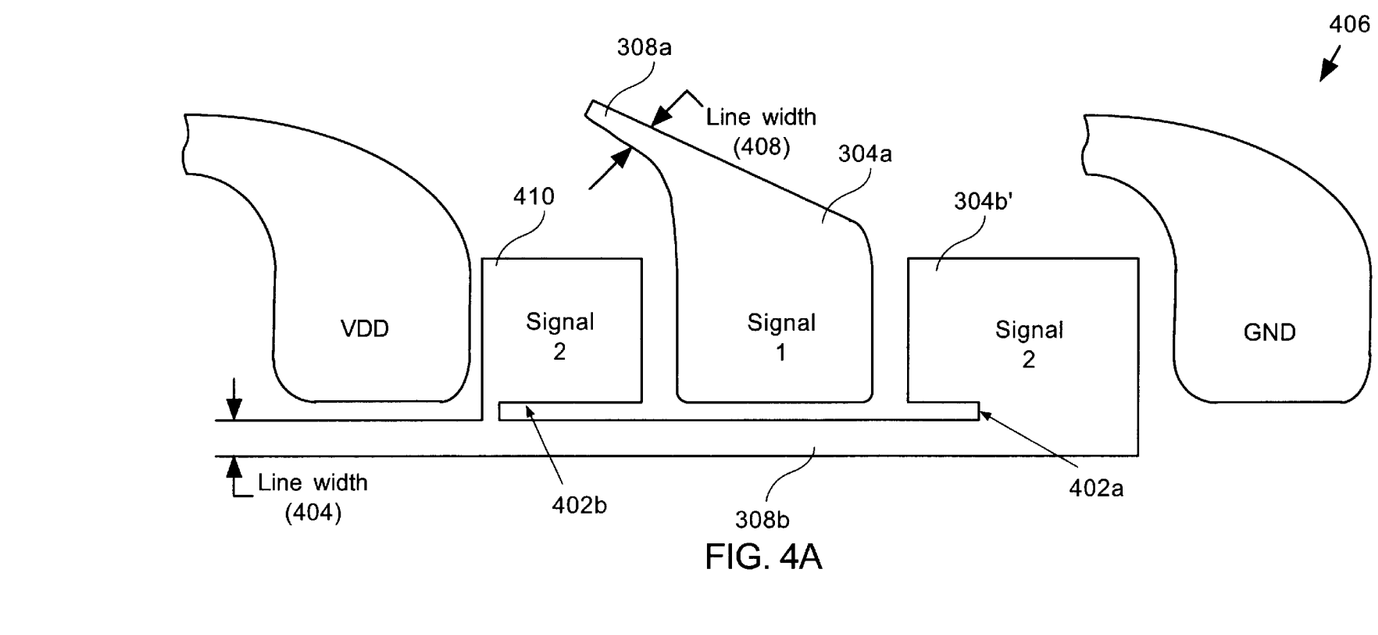
FIG. 4A is a more detailed top view of a portion of a equalized redistribution layout cell in accordance with an alternative embodiment of the present invention.

FIG. 4A is a more detailed top view of a portion of a equalized redistribution layout cell 406 in accordance with an alternative embodiment of the present invention. As shown, the equalized redistribution layout cell 406 includes bump pads (e.g., 304*a* and 304*b'*) that are electrically connected to associated traces (e.g., 308*a* and 308*b*). As discussed, the purpose of a redistribution layout cell is to route signals to their associated bump pads. For example, signal 1 is routed through trace 308*a* to bump pad 304*a* and signal 2 is routed through trace 308*b* to bump pad 304*b'*. Likewise, Vdd and GND signals may be routed to their respective bump pads as shown in this example.

Various shapes may be utilized to equalize capacitance between signals. As described with reference to FIG. 3B, for example, the size of the bump pads 304*a* and 304*b* was increased in order to equalize capacitance. By way of another example, capacitance may also be equalized by attaching capacitance extending stubs at any position along the trace. FIG. 4A illustrates the implementation of these capacitance extending stubs for equalizing capacitance.

More specifically, FIG. 4A shows two ways for equalizing the capacitance of signal 1 and signal 2. As mentioned above, one way is to vary the size of the bump pads (i.e., bump pad 304*a* and bump pad 304*b'* were sized to equalize the capacitance). Another way to equalize capacitance is to add capacitance extending stubs to a trace at positions along the trace where space is available. As shown, the trace 308*b* of signal 2 includes a capacitance extending stub 410 that is located between the Vdd bump pad and the signal 1 bump pad 304*a*. In sum, since the total capacitance for signal 2 includes the capacitance of the slot pad (not shown), trace 308*b*, capacitance extending stub 410, and bump pad 304*b'*, the total capacitance for the path of signal 2 may be equalized by choosing the appropriate sizes for the capacitance extending stub 410 and bump pad 304*b'*.

Similarly, various structures may be utilized to equalize resistance between signals. As described in reference to FIG. 3B, for example, a trace may be widened or narrowed so as to equalize resistance. By way of another example, a signal's resistance may be equalized by adding notches (e.g., 402a and 402b) to appropriate places along the signal path so as to control the resistance along the signal path. FIG. 4A illustrates one example of the implementation of notches 402a and 402b for equalizing resistance.

As shown in FIG. 4A, the trace widths (e.g., 404 and 408) are sized so as to equalize resistance between signals 1 and 2. As shown, signal 2 has a relatively long trace 308b, and therefore, has a wider trace width 404 than signal 1. Signal 1, on the other hand, has a relatively short trace 308a, and therefore, has a narrower trace width 408 than signal 2. In addition to varying the trace widths, the capacitance extending stub 410 includes the aforementioned notch 402b to prevent large decreases in the resistance for signal 2. Likewise, bump pad 304b' includes a notch 402a. Therefore, these notches (402a and 402b) have the effect of preventing a decrease in resistance along the path of signal 2.

Of course, the present invention may include a capacitance extending stub (e.g., 410) that may not have a notch (e.g., 402b). Likewise, the present invention may include a notched bump pad (e.g., 304b') and not a capacitance extending stub. In sum, the present invention may include any combination of the aforementioned features.

As in FIG. 3B, the features of FIG. 4A are chosen so as to equalize capacitance and resistance between signals while maintaining a given bump pad pitch. For this example, the bump pad pitch would remain at about 200 μm for the equalized redistribution layout cell 406. In other words, the sizes of the capacitance extending stub 410, bump pad 304b', and bump pad 304a are chosen so as to efficiently use available space for a given bump pad pitch.

Figure 4B:
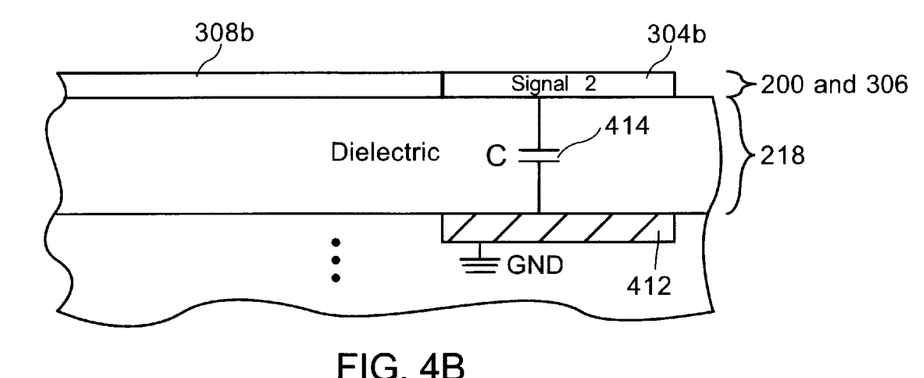
FIG. 4B is a cross section view of a lumped capacitor that is created from the redistribution layout cell of FIG. 3B and a lower patterned metallization layer in accordance with one embodiment of the present invention.

FIG. 4B is a cross section view of a lumped capacitor 414 that is created from the redistribution layout cell 306 of FIG. 3B and a lower patterned metallization layer 412 in accordance with one embodiment of the present invention. As described above, the slot pad 202, trace 308b, and bump pad 304b are electrically interconnected and may be formed from a patterned metallization layer. Thus, the slot pad 202, trace 308b, and bump pad 304b of the present embodiment function as an upper plate of the lumped capacitor 414. Similarly, the lower patterned metallization layer 412 is connected to GND, and functions as a lower plate of the lumped capacitor 414. To complete the lumped capacitor 414, a lower dielectric layer 218 lies between the lower patterned metallization layer 412 and redistribution layout cell 306. Although each plate may be sized in any way so as to equalize the capacitance, preferably, the area of the lower plate is at least as large as the area of the above bump pad 304b or capacitance extending stub 410. In the computation of capacitance, both the parallel plate and fringing components of capacitance need to be considered.

Figure 4C:
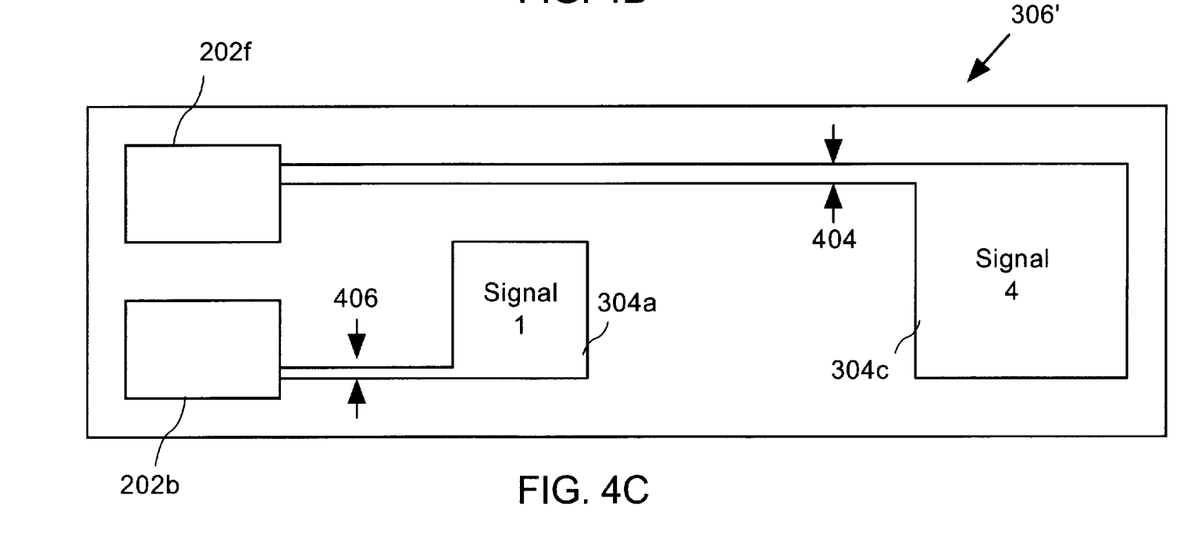
FIG. 4C is a top view of an exemplary portion of the equalized redistribution layout cell in accordance with one embodiment of the present invention.

FIG. 4C is a top view of an exemplary portion of the equalized redistribution layout cell 306' in accordance with one embodiment of the present invention. As shown, a trace 406 is connected to the bottom of a bump pad 304a, and a trace 404 is connected to the top of a bump pad 304c. This alternating arrangement efficiently utilizes available space. Therefore, for a given bump pad pitch, the traces may be arranged in many ways.

Figure 5A:
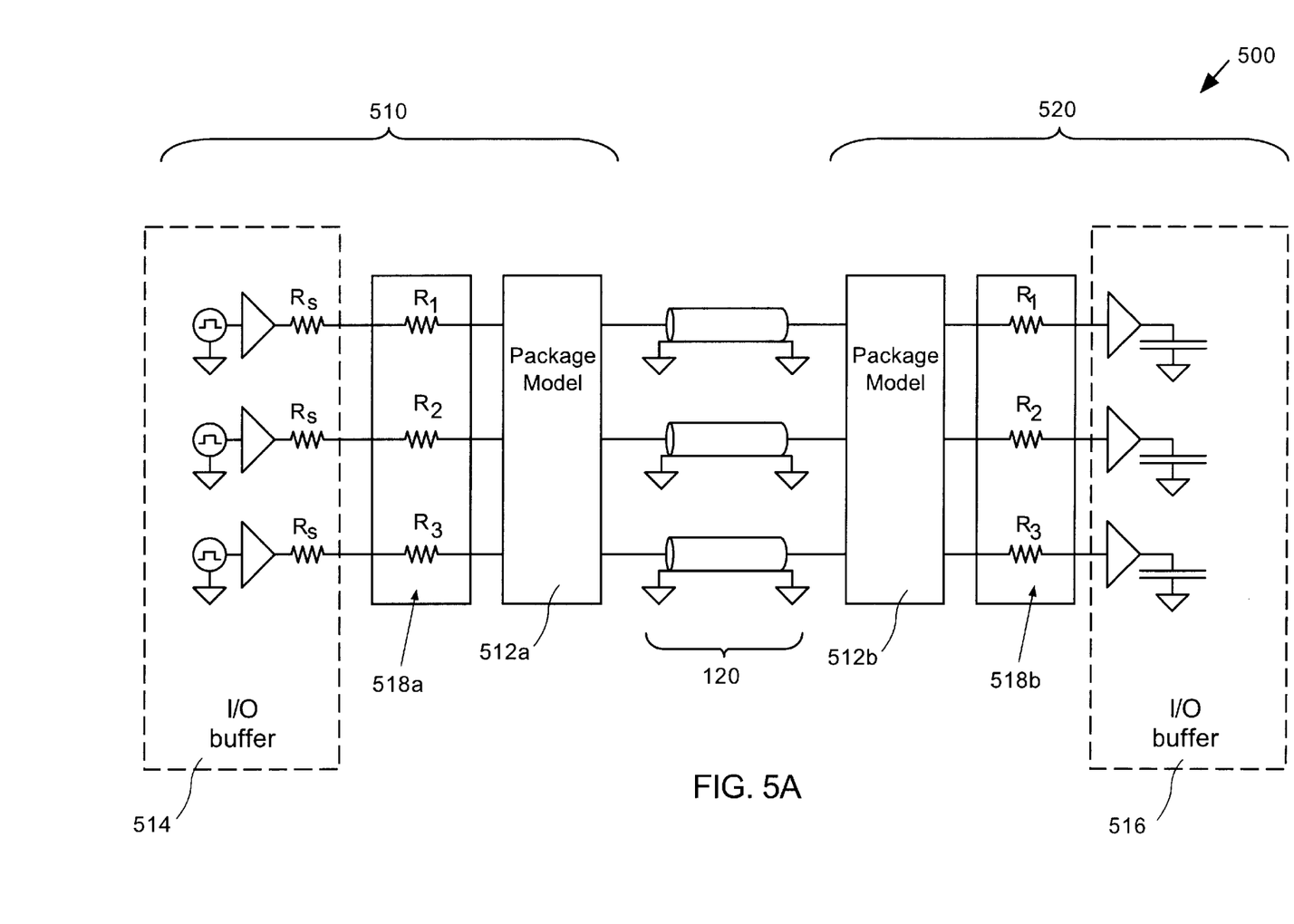
FIG. 5A is a diagrammatic representation of an integrated circuit system having a pair of IC devices that have redistribution layers in accordance with one embodiment of the present invention.

FIG. 5A is a diagrammatic representation of an integrated circuit system 500 having a pair of IC devices that have redistribution layers (e.g., 518a and 518b) in accordance with one embodiment of the present invention. As shown, the integrated circuit system 500 includes two flip type devices 510 and 520. The flip type device 510 includes an array of I/O buffers 514, a redistribution layer 518a, and a package model 512a. The flip type device 520 includes an array of I/O buffers 516, a redistribution layer 518b, and a package model 512b. Therefore, the two flip type devices 510 and 520 are electrically interconnected through the PC Board 120 (i.e., similar to the arrangement of FIG. 1C).

In this embodiment, a signal may be output from one of the of I/O buffers 514 to one of the array of I/O buffers 516. In other words, a signal may be caused to propagate from one of the array of I/O buffers 514 of the flip chip device 510, through the redistribution layer 518a, through the package model 512a, through the PC Board 120, through the package model 512b, through the redistribution layer 518b, and to one of the array of I/O buffers 516 of the flip chip device 520.

The array of I/O buffers 514 of flip chip device 510 include a termination resistor "Rs" at the output of each one of the array I/O buffer. Since the resistor Rs is placed at the start of the signal's path (e.g., in series with the array of I/O buffers 514), this is referred to as a "series termination". With this "series termination" arrangement, it should, therefore, be apparent that each stage of the integrated circuit system 500 should be substantially equalized in terms of both resistance and capacitance to avoid introducing signal skew between chips. Accordingly, the fact that each of the signals in the redistribution layers 518a and 518b may be equalized for both resistance and capacitance is a powerful design feature.

Figure 5B:
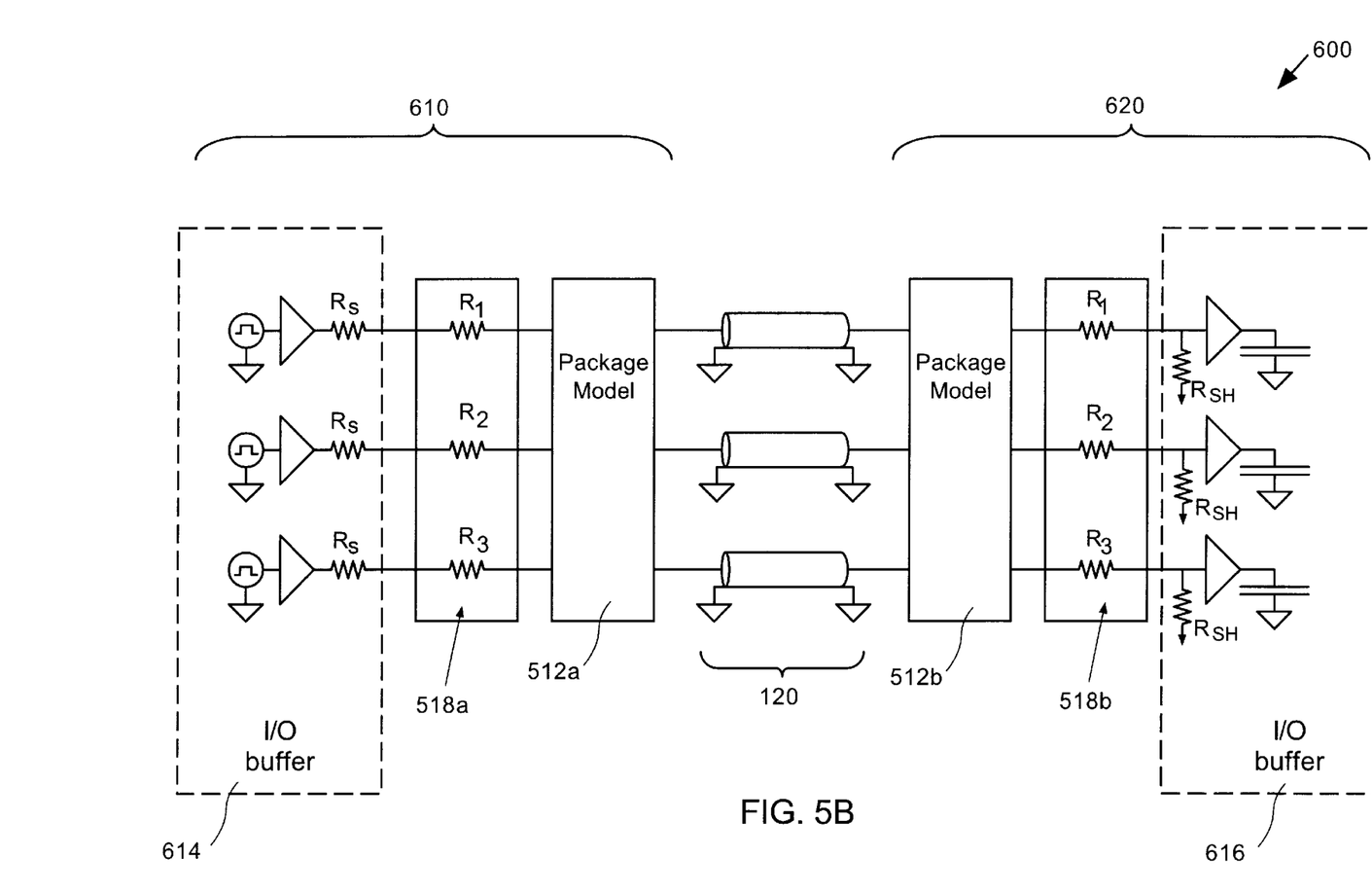
FIG. 5B is a diagrammatic representation of an integrated circuit system having a pair of IC devices that have redistribution layers in accordance with an alternative embodiment of the present invention.

FIG. 5B is a diagrammatic representation of an integrated circuit system 600 having a pair of IC devices that have redistribution layers (e.g., 518a and 518b) in accordance with an alternative embodiment of the present invention. As shown, a flip type device 610 includes an array of I/O buffers 614, and a flip type device 620 includes an array of I/O buffers 616. In contrast to the integrated circuit system 500 of FIG. 5A, however, an "Rs" resistor is not connected between the output of each one of the array I/O buffer 614 and a redistribution layer 518a of the flip type device 610. Instead, a shunt resistor "Rsh" is connected between a redistribution layer 518b of the flip type device 620 and the input of each one of the array I/O buffer 616. Since the shunt resistors "Rsh" are placed at the end of the signal's path (e.g., in a shunt arrangement at the array of I/O buffers 616), this is referred to as a "shunt termination".

As in the integrated circuit system 500, equalizing the resistance and capacitance is an important design consideration in the integrated circuit system 600 in order to minimize skew between flip type device 610 and 620. Additionally, the precision control of coupled noise is even more important in "shunt termination" arrangements. Thus, the ability to control coupled noise may in some cases be even more important than the ability to control skew. Consequently, the equalization of resistance and capacitance in the redistribution layers (e.g., 518a and 518b) is an important design technique that will improve flexibility as well as provide cost-effective redistribution layers for use in application specific integrated circuits (ASICs).

Figure 5C:
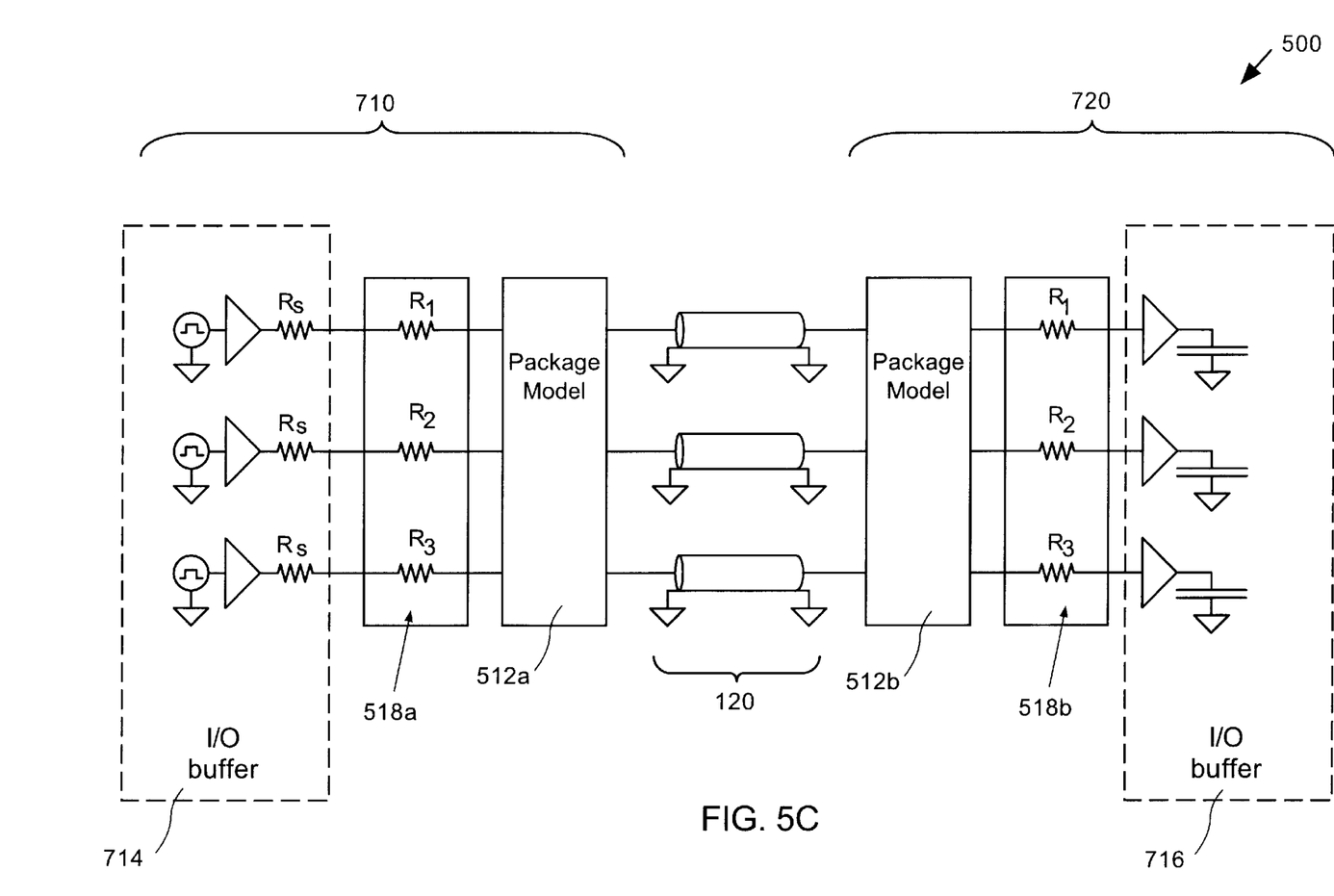
FIG. 5C is a diagrammatic representation of an integrated circuit system having a pair of IC devices that have redistribution layers in accordance with an alternative embodiment of the present invention.

FIG. 5C is a diagrammatic representation of an integrated circuit system 700 having a pair of IC devices that have redistribution layers (e.g., 518a and 518b) in accordance with an alternative embodiment of the present invention. As shown, a flip type device 710 includes an array of I/O buffers 714, while a flip type device 720 includes an array of I/O buffers 716. In contrast to the integrated circuit system 500 and 600, however, an "Rs" resistor is not connected between the output of each one of the array I/O buffer 714 and a redistribution layer 518a of the flip type device 610, and a shunt resistor "Rsh" is not connected between a redistribution layer 518b and each one of the array of I/O buffers 716. In sum, the integrated circuit system 700 is "unterminated". Similar to integrated circuit systems 500 and 700, the control of skew and coupled noise is an important design consideration. Thus, the equalization of resistance and capacitance of the redistribution layers 518a and 518b is an advantageous and powerful design capability.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A redistribution layer having a patterned metallization layer for use in a flip chip integrated circuit device, comprising:

a plurality of slot pads arranged along a periphery of the redistribution layer, the plurality of slot pads being formed from the patterned metallization layer;

an array of bump pads being arranged in an inner portion of the redistribution layer such that the plurality of slot pads surround the array of bump pads, and the array of bump pads being formed from the patterned metallization layer, wherein each bump pad of the array of bump pads has a surface area that is selected to substantially equalize a capacitance parameter associated with an interconnection between a first selected one of the plurality of slot pads and a first bump pad of the array of bump pads; and a plurality of traces formed from the patterned metallization layer being configured to interconnect the plurality of slot pads to the array of bump pads, such that each of the traces has a width that is selected to substantially equalize a resistance parameter associated with each of the plurality of traces.

2. A redistribution layer having a patterned metallization layer for use in a flip chip integrated circuit device as recited in claim 1, wherein a shorter length of a first trace of the plurality of traces has a thinner width relative to a longer length of a second trace of the plurality of traces.

3. A redistribution layer having a patterned metallization layer for use in a flip chip integrated circuit device as recited in claim 1, wherein the capacitance parameter is equalized with respect to a selected adjacent interconnection between a second selected one of the plurality of slot pads and a second bump pad of the array of bump pads.

4. A redistribution layer having a patterned metallization layer for use in a flip chip integrated circuit device as recited in claim 3, further including a capacitance extending stub that is connected to a selected one of the plurality of traces, an area of the capacitance extending stub being sized to equalize the capacitance parameter for the selected one of the plurality of traces.

5. A redistribution layer having a patterned metallization layer for use in a flip chip integrated circuit device as recited in claim 4, wherein the capacitance extending stub has a notch and a stub resistance, the notch being configured to prevent the resistance parameter associated with the selected one of the plurality of traces from substantially decreasing in response to the stub resistance.

6. A redistribution layer having a patterned metallization layer for use in a flip chip integrated circuit device as recited in claim 1, wherein at least one of the plurality of bump pads has a notch and an associated bump pad resistance, and the notch is configured to prevent the resistance parameter associated with a selected one of the plurality of traces from substantially decreasing in response to the bump pad resistance.

7. A redistribution layer having a patterned metallization layer for use in a flip chip integrated circuit device as recited in claim 1, wherein the redistribution layer is formed over a lower dielectric layer, and the lower dielectric layer is formed over a lower patterned metallization layer that is coupled to a ground.

8. A redistribution layer having a patterned metallization layer for use in a flip chip integrated circuit device as recited in claim 7, wherein a lumped capacitor has a upper plate that is formed from the redistribution layer, a lower plate that is formed from the lower patterned metallization layer, and the lower dielectric layer that lies between the redistribution layer and the lower patterned metallization layer.

9. A redistribution layer having a patterned metallization layer for use in a flip chip integrated circuit device as recited in claim 8, wherein the upper plate of the lumped capacitor includes a first bump pad of the plurality of bump pads, a first trace of the plurality of the traces that is connected to the first bump pad, and a first slot pad of the plurality of slot pads that is connected to the first trace, such that a lower capacitance area of the lower plate is configured to be at least as large as the surface area of the first bump pad.

10. A redistribution layer having a patterned metallization layer for use in a flip chip integrated circuit device as recited in claim 1, further including an additional power and ground routing area arranged in a center of the redistribution layer such that the array of bump pads surround the additional power and ground routing area.

11. A redistribution layer having a patterned metallization layer for use in a flip chip integrated circuit device as recited in claim 1, wherein the array of bump pads are arranged throughout the redistribution layer.

12. A redistribution layer having a patterned metallization layer for use in a flip chip integrated circuit device as recited in claim 1, wherein each one of the array of bump pads has a pitch of about 200 $\mu$m between each of an adjacent bump pad.

13. A redistribution layer formed from a patterned metallization layer, comprising:

a plurality of slot pads arranged along a periphery of the redistribution layer, the plurality of slot pads being formed from the patterned metallization layer, wherein a first slot pad has a first slot pad capacitance value and a second slot pad has a second slot pad capacitance value;

an array of bump pads being arranged in an inner portion of the redistribution layer such that the plurality of slot pads surround the array of bump pads, and the array of bump pads being formed from the patterned metallization layer, wherein a first bump pad of the array of bump pads has a first surface area having a first bump pad capacitance value and a second bump pad of the array of bump pads has a second surface area having a second bump pad capacitance value;

a plurality of traces having a plurality of widths formed from the patterned metallization layer being configured to interconnect the plurality of slot pads to the array of bump pads, wherein a first trace that electrically connects the first bump pad to the first slot pad has a first trace capacitance and a first length, and a second trace that electrically connects the second bump pad to the second slot pad has a second trace capacitance value and a second length, the first length being different than the second length, and wherein the first surface area of the first bump pad is sized such that the first bump pad capacitance value, plus the first trace capacitance value, plus the first slot pad capacitance value substantially equals the second bump pad capacitance value, plus the second trace capacitance value, plus the second slot pad capacitance value.

14. A redistribution layer formed from a patterned metallization layer as recited in claim 13, wherein the first surface area of the first bump pad is greater than the second surface area of the second bump pad, and the first length is shorter than the second length.

15. A redistribution layer formed from a patterned metallization layer as recited in claim 13, wherein the first trace includes a first width and a first resistance value, and the second trace includes a second width and a second resistance value, the first width and the second width are selected so that the first resistance value substantially equals the second resistance value.

16. A redistribution layer formed from a patterned metallization layer as recited in claim 15, wherein the first trace has a capacitance extending stub that is sized such that the first bump pad capacitance value plus the first trace capacitance value plus the first slot pad capacitance value substantially equals the second bump pad capacitance value plus the second trace capacitance value plus the second slot pad capacitance value.

17. A redistribution layer formed from a patterned metallization layer as recited in claim 15, wherein the first width is narrower than the second width, and the first length of the first trace is shorter than the second length of the second trace.

18. A redistribution layer formed from a patterned metallization layer as recited in claim 17, wherein the first trace has a capacitance extending stub that is sized such that the first bump pad capacitance value plus the first trace capacitance value plus the first slot pad capacitance value substantially equals the second bump pad capacitance value plus the second trace capacitance value plus the second slot pad capacitance value.

19. A redistribution layer formed from a patterned metallization layer as recited in claim 13, wherein the first trace has a capacitance extending stub that is sized such that the first bump pad capacitance value plus the first trace capacitance value plus the first slot pad capacitance value substantially equals the second bump pad capacitance value plus the second trace capacitance value plus the second slot pad capacitance value.

20. A redistribution layer formed from a patterned metallization layer as recited in claim 19, wherein the first length of the first trace is shorter than the second length of the second trace.

21. A redistribution layer formed from a patterned metallization layer as recited in claim 17, wherein the first width of the first trace is about 10 $\mu$m.

22. A redistribution layer formed from a patterned metallization layer as recited in claim 21, wherein the second width of the second trace is between about 25 $\mu$m and 30 $\mu$m.

23. A redistribution layer formed from a patterned metallization layer as recited in claim 22, wherein the first surface area of the first bump pad is about 280 $\mu$m by about 90 $\mu$m.

24. A redistribution layer formed from a patterned metallization layer as recited in claim 13, wherein the first surface area of the first bump pad is sized so as to minimize skew between a first signal that is output from the first bump pad and a second signal that is output from second bump pad.

25. A redistribution layer formed from a patterned metallization layer as recited in claim 15, wherein the first width of the first trace is selected so as to control skew between a first signal that is output from the first bump pad and a second signal that is output from second bump pad, and the first surface area of the first bump pad is sized so as to minimize skew between a first signal that is output from the first bump pad and a second signal that is output from second bump pad.

26. A redistribution layer formed from a patterned metallization layer as recited in claim 25, wherein the first width of the first trace is selected so as to control coupled noise between the first signal and second signal.

27. A redistribution layer formed from a patterned metallization layer as recited in claim 13, wherein the redistribution layer is formed on an integrated circuit that is a flip chip device.

28. A redistribution layer formed from a patterned metallization layer as recited in claim 27, wherein the flip chip device is attached to a PC board having traces that interconnect to a second flip chip device having the redistribution layer.

29. A redistribution layer formed from a patterned metallization layer, comprising:

a plurality of slot pads arranged along a periphery of the redistribution layer, the plurality of slot pads being formed from the patterned metallization layer, wherein a first slot pad has a first slot pad capacitance value and a second slot pad has a second slot pad capacitance value;

an array of bump pads being arranged in an inner portion of the redistribution layer such that the plurality of slot pads surround the array of bump pads, and the array of bump pads being formed from the patterned metallization layer, wherein a first bump pad of the array of bump pads has a first surface area having a first bump pad capacitance value and a second bump pad of the array of bump pads has a second surface area having a second bump pad capacitance value;

a plurality of traces having a plurality of widths formed from the patterned metallization layer being configured to interconnect the plurality of slot pads to the array of bump pads, wherein a first trace that electrically connects the first bump pad to the first slot pad has a first trace capacitance and a first length, and a second trace that electrically connects the second bump pad to the second slot pad has a second trace capacitance value and a second length, the first length being different than the second length; and a capacitance extending stub located on the first trace, and wherein an area of the capacitance extending stub and the first surface area of the first bump pad are sized such that the first bump pad capacitance value, plus the first trace capacitance value, plus the first slot pad capacitance value substantially equals the second bump pad capacitance value, plus the second trace capacitance value, plus the second slot pad capacitance value.

30. A redistribution layer formed from a patterned metallization layer as recited in claim 29, wherein the first width is narrower than the second width, and the first length of the first trace is shorter than the second length of the second trace.

* * * * *